United States Patent [19]

Tayama

[11] Patent Number: 5,694,127
[45] Date of Patent: Dec. 2, 1997

[54] METHOD AND APPARATUS FOR EFFICIENTLY GENERATING VARIABLE LENGTH CODE DATA

[75] Inventor: Masashi Tayama, Sunnyvale, Calif.

[73] Assignee: Zapex Technologies, Inc., Mountain View, Calif.

[21] Appl. No.: 544,032

[22] Filed: Oct. 17, 1995

[51] Int. Cl.$^6$ ................................................. H03M 7/40
[52] U.S. Cl. ............................................. 341/67; 341/106
[58] Field of Search ................................... 341/50, 51, 67, 341/106

[56] References Cited

U.S. PATENT DOCUMENTS

| | | | |
|---|---|---|---|
| 5,227,878 | 7/1993 | Puri et al. | 358/136 |
| 5,400,075 | 3/1995 | Savatier | 348/384 |
| 5,497,153 | 3/1996 | Jeong | 341/67 |
| 5,550,542 | 8/1996 | Inoue | 341/67 |
| 5,579,413 | 11/1996 | Bjontegaard | 382/248 |

*Primary Examiner*—Marc S. Hoff
*Attorney, Agent, or Firm*—Blakely, Sokoloff, Taylor & Zafman LLP

[57] ABSTRACT

Optimizing the encoding time for a variable length coding unit involves allowing the 8×8 blocks to be processed consecutively. Thus, a method and apparatus that allows for efficient processing of the 8×8 blocks consecutively is required. A method and apparatus is provided that generates variable length code (VLC) data without requiring buffer memory for storing coefficient data temporarily or special circuitry for generating end-of-block (EOB) Codes. An input code is received. The input code includes an end-of-block (EOB) indicator, a zero run-length, and a coefficient level. The input code is converted into a corresponding VLC and the VLC is output. The input code is converted into the corresponding VLC by: (1) Forming an address based upon the EOB indicator, the zero run-length, and the coefficient level. For example, the EOB indicator may be the most significant bit of the address, followed by the zero run-length, and the least significant portion of the address may be the coefficient level. (2) Applying the address to one or more storage devices having stored therein a first group of VLC data entries and a second group of VLC data entries. (3) And, if the EOB indicator indicates that the input code is associated with the end of a block then, retrieving the corresponding VLC from a VLC data entry in the first group of VLC data entries; otherwise, retrieving the corresponding VLC from a VLC data entry in the second group of VLC data entries.

13 Claims, 7 Drawing Sheets

Figure 1

|    |    |    |    |    |    |    |    |
|----|----|----|----|----|----|----|----|
| 0  | 0  | 0  | 0  | 0  | 0  | 0  | -3 |
| 0  | 0  | 0  | 0  | 1  | 0  | 0  | 0  |
| 0  | 0  | 0  | 0  | 0  | 0  | 0  | 0  |
| 0  | -1 | 0  | 0  | 0  | 0  | 0  | 0  |
| 0  | 0  | 0  | 0  | 0  | 0  | 0  | 0  |
| 2  | 0  | 1  | 0  | 0  | 0  | 0  | 0  |
| 1  | 22 | 0  | 0  | 0  | 0  | 0  | 0  |
| 10 | 0  | 0  | 0  | 0  | 0  | 0  | 0  |

| Run-Length and Coefficient Level Input | Address From Input | Data[32:0] Output | |
|---|---|---|---|
| | | Length | Variable Length Code (VLC) |
| (0, 2), w/o EOB | 00002h | 0010 1010 | 0000 0010 0000 0000 0000 0000 0000 0000 0 |
| (0, 2), w EOB | 40002h | 0011 1010 | 0010 0000 1000 0000 0000 0000 0000 0000 0 |
| (6, 1), w/o EOB | 06001h | 0011 1000 | 1010 0000 0000 0000 0000 0000 0000 0000 0 |
| (6, 1), w EOB | 46001h | 0100 1000 | 1000 1000 0000 0000 0000 0000 0000 0000 0 |

METHOD AND APPARATUS FOR EFFICIENTLY GENERATING VARIABLE LENGTH CODE DATA

FIELD OF THE INVENTION

The present invention relates to the compression of the amount of data necessary to reproduce a high quality of video picture. In particular, the present invention discloses an efficient method for implementing a variable length encoder for use in a digital video encoder that compresses a video signal into a digital bitstream.

BACKGROUND OF THE INVENTION

Digital video is a rapidly growing application of computer technology. However, there are difficulties associated with digital video. When an analog video signal is digitized into digital video data, the amount of digital video data produced is enormous, even for short video signals. One of the most common difficulties is managing the large amounts of data. To reduce the amount of digital data required to represent an analog video signal, compression algorithms are used. Typical video compression algorithms reduce the amount of data required to represent the video by taking advantage of the redundancy between successive video frames (temporal redundancy).

The most widely used video compression systems are commonly known as MPEG-1 and MPEG-2 standards. MPEG-1 and MPEG-2 each define a compressed digital bit stream for transmitting digital video. The MPEG-1 and MPEG-2 standards are creations of the International Standards Organization's (ISO) Moving Picture Expert Group. (MPEG is an acronym for Moving Picture Expert Group)

In an MPEG system, frames of a digital video image are divided into macroblocks. A macroblock comprises a 16×16 pixel block (luminance) and two 8×8 pixel blocks (chrominance). The MPEG digital video encoding standard generally further divides each macroblock into six 8×8 pixel blocks and encodes each block.

Figure 1:
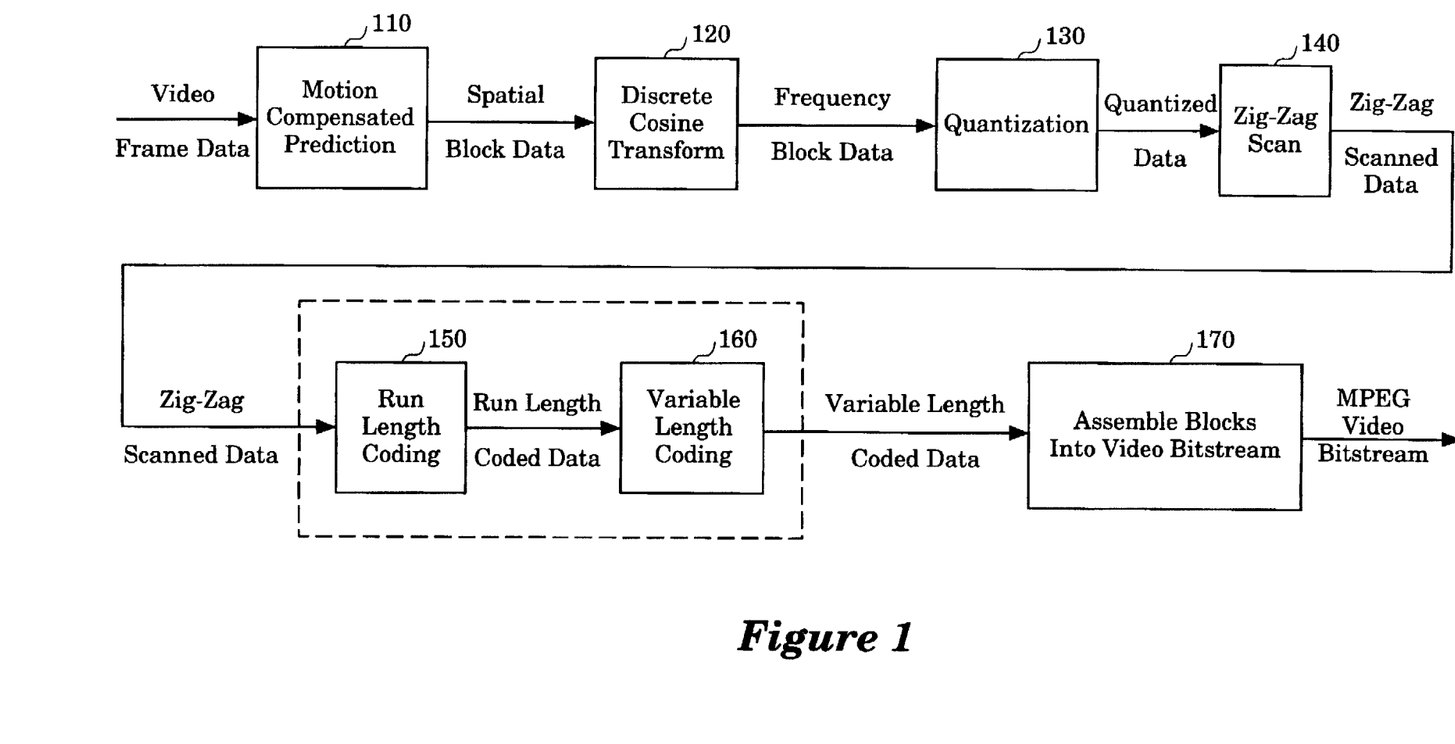
FIG. 1 illustrates a general flow diagram of the encoding process for MPEG video.

The encoding process for MPEG video is illustrated in FIG. 1. Typically, the discrete cosine transform (DCT) of step 120 is done by dedicated circuits at the block level, and the encoding process as a whole is performed at the macroblock level. This means DCT is performed six times for each macroblock since one macroblock consists of six blocks. To optimize encoding time, these blocks need to be sent to the DCT circuits consecutively (with no interval between the blocks). Later, during the variable length coding process (step 160), variable length code (VLC) data is retrieved from a ROM array for the non-zero coefficients. However, if 64th coefficient value is not zero, the variable length coding process 160 would be required to access the memory twice—once to retrieve the variable length code (VLC) and the VLC length and a second time to retrieve the appropriate EOB code. Since the data from the previous steps is consecutive, a problem exists because the timing for retrieving the EOB code is the same as the access timing for the first coefficient of the next block.

One solution would be to insert gaps using a buffer memory to store coefficient data temporarily after the discrete cosine transform stage 120. Another solution would be to include special circuits in the encoder to attach the end-of-block (EOB) code after the variable length coding process 160 accesses the table memory for the 64th coefficient's VLC data. However, both of these solutions have limitations. First, the complexity of the encoder would be increased. Additionally, the buffer memory solution is not time efficient. Using a buffer memory to introduce artificial gaps, would result in increased encoding time.

The MPEG-1 and MPEG-2 digital video standards are currently being implemented in professional and consumer video products. In order to effectively market a consumer product that implements an MPEG standard, it is important to perform the encoding efficiently and to keep the product cost low. In accordance with this goal, it is desirable to implement MPEG encoders that process the 8×8 blocks consecutively, while using the smallest number of integrated circuits as possible.

SUMMARY OF THE INVENTION

It is therefore desirable to optimize the encoding time of a digital video encoder system. Specifically, it is an object of the present invention to optimize encoding time by allowing the processing of the 8×8 blocks consecutively in an MPEG encoder.

A method and apparatus are disclosed for efficiently generating variable length code (VLC) data. An input code is received. The input code includes an end-of-block (EOB) indicator, a zero run-length, and a coefficient level. The input code is converted into a corresponding VLC and the VLC is output. The input code is converted into the corresponding VLC by: (1) Forming an address based upon the EOB indicator, the zero run-length, and the coefficient level. (2) Applying the address to one or more storage devices having stored therein a first group of VLC data entries and a second group of VLC data entries. (3) And, if the EOB indicator indicates that the input code is associated with the end of a block then, retrieving the corresponding VLC from a VLC data entry in the first group of VLC data entries; otherwise, retrieving the corresponding VLC from a VLC data entry in the second group of VLC data entries.

The present invention efficiently generates variable length code (VLC) data by introducing a VLC table for simplifying encoder circuits. Specifically, the teachings of the present invention allow VLC data to be generated without requiring buffer memory for storing coefficient data temporarily or special circuitry for generating end-of-block (EOB) codes. Therefore, the present invention allows optimal encoding time.

Other objects, features and advantages of the present invention will be apparent from the accompanying drawings, and from the detailed description that follows.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

A method and apparatus for efficiently generating and using variable length code data is disclosed. In the following description, for purposes of explanation, specific nomenclature is set forth to provide a thorough understanding of the present invention. However, it will be apparent to one skilled in the art that these specific details are not required in order to practice the present invention. For example, the present invention will be described with reference to the MPEG-2 digital video encoding standard, however the teachings of the present invention can be used in other systems that implement variable length encoding. In other instances, well known circuits and devices are shown in block diagram form in order not to obscure the present invention unnecessarily.

FIG. 1 illustrates a general flow diagram of the encoding process for MPEG video. The flow diagram shows the interaction among the encoding steps performed on each block by an MPEG-2 video encoder. Video frame data is input to the encoding process and ultimately the encoded blocks are combined to create an MPEG video bitstream logically organized in the form of encoded video flames.

Referring, again, to FIG. 1, the first step (step 110) is to perform Motion compensation prediction or intra-frame encoding on the block. Motion compensation prediction is the process of determining a block in a previous or later frame that is similar to the block being analyzed in the current frame. In some frames, no motion compensation prediction is performed and the entire frame is encoded without reference to other frames. Such frames are known as intra-frames or I-frames. Video frame data is an input into the Motion compensation or intra-frame encoding stage (step 110) and the output is a spatial block data.

The spatial block data is then processed by a Discrete Cosine Transformer at step 120. The Discrete Cosine Transformer changes the information from a spatial domain to a frequency domain. The output of the Discrete Cosine Transformer is frequency block data.

Figure 2A:
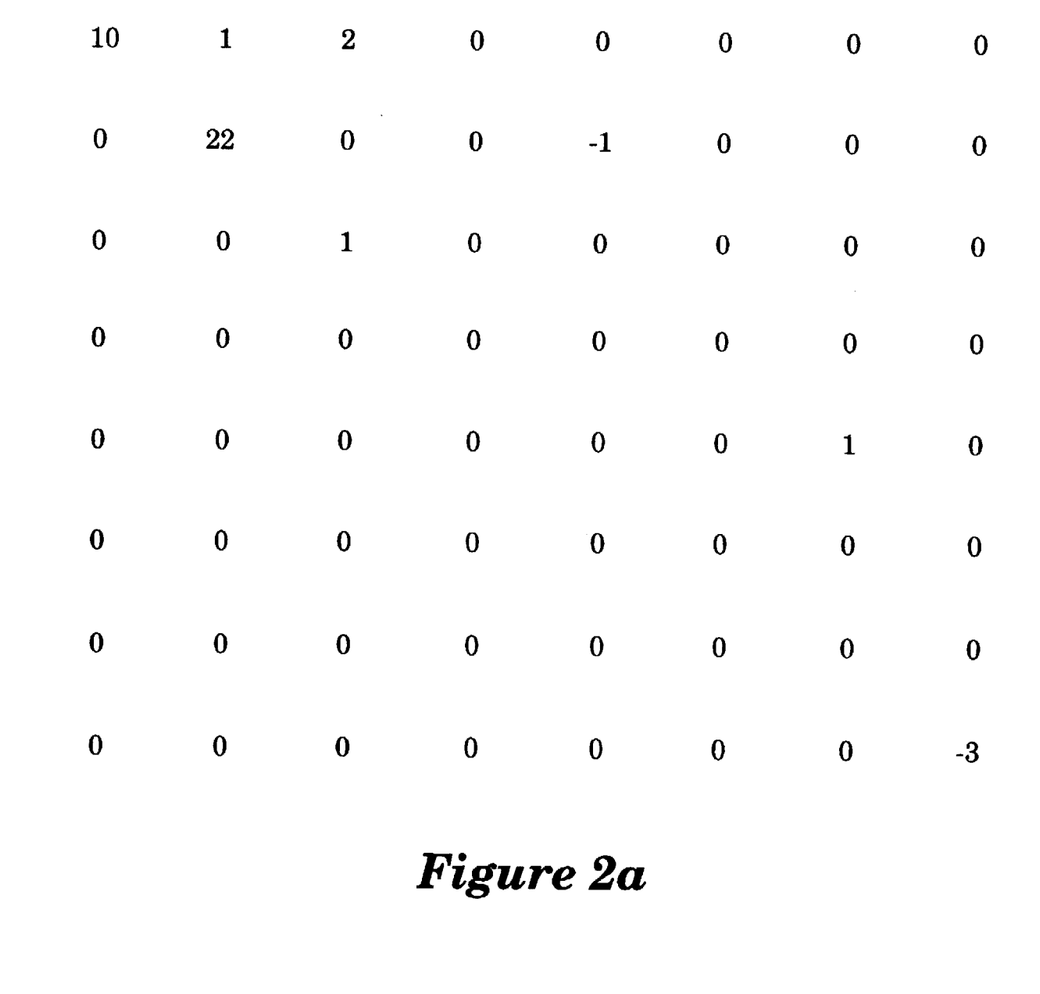
FIG. 2a is an example of quantized frequency data from a block.

The frequency block data is then quantized and scanned. The quantization process, step 130, discards information which has no visual significance by reducing the precision of the frequency block coefficients to the minimum level required to achieve a given image quality. At step 130, the frequency block coefficients are divided by some predetermined value, the quantizer step size, such that some drop bits off the bottom end. The goal of the quantization process is to reduce the number of non-zero coefficients so the information can be compressed more easily. An 8×8 sample of quantized block frequency data is illustrated in FIG. 2a.

Figure 2B:
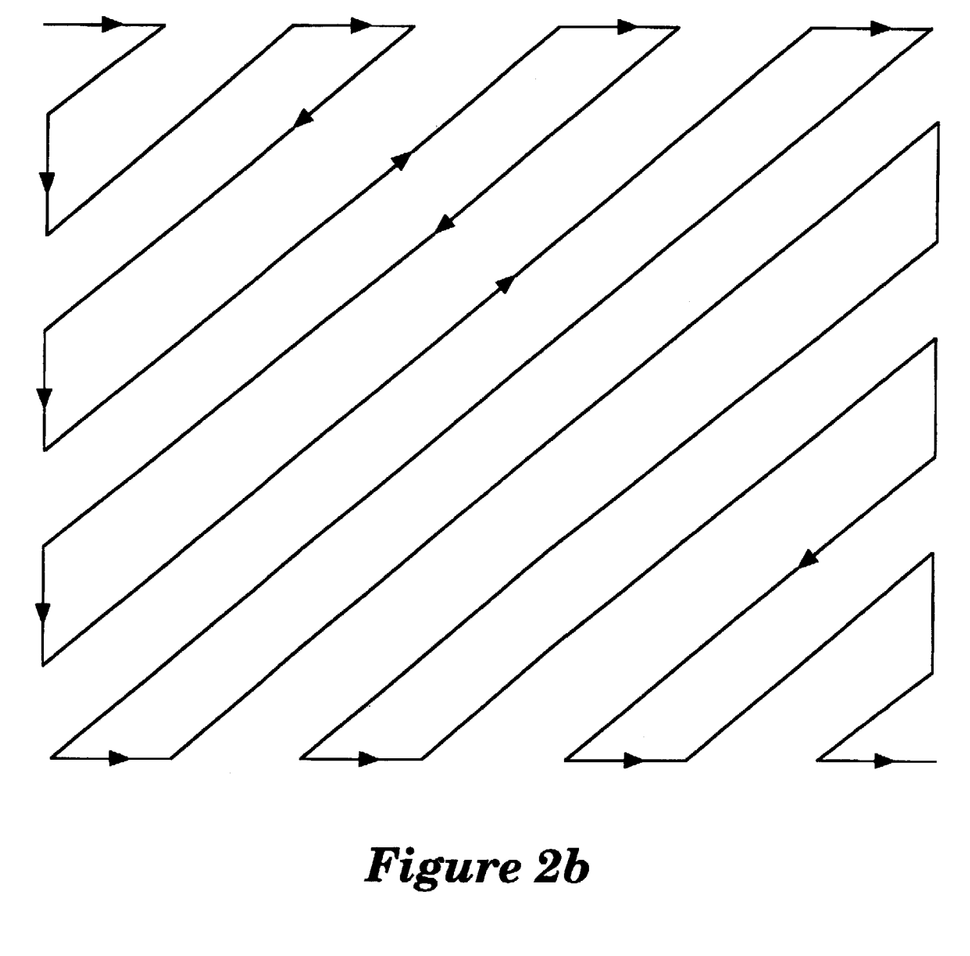
FIG. 2b is a conceptual diagram that illustrates how the quantized frequency data is scanned with a zig-zag scan.

The quantized data is then scanned using Zig-Zag scan at step 140. The Zig-Zag scan is conceptually illustrated in FIG. 2b. The Zig-Zag scan produces a long stream of quantized coefficient values that contain strings of zeros. The string of quantized values is then processed a Run-Length Coder at step 150. The Run-Length Coder replaces the strings of zeros with a number that indicates the number of zeros (the "run-length" of zeros). The output of this step is a set of data pairs. The first value of the data pair represents the run-length of zeros between the current non-zero coefficient and previous non-zero coefficient. The other value of the pair is the level of the current non-zero coefficient. When the quantized data of FIG. 2a is Zig-Zag scanned and run-length coded, the output run-length/level pairs are as follows:

(0, 10), (0, 1), (2, 22), (0, 2), (6, 1), (3, −1), (35, 1), (10, −3) where the first value of each pair represents the zero run-length and the second value of each pair represents the non-zero coefficient level.

Finally, the Run Length Coded data is put through a Variable Length Coder at step 160. The Variable Length Coder converts the run-length/level data into variable length codes wherein run-length/level pairs that appear frequently are represented by short codes and rare run-length/level pairs are represented by longer codes. If the data listed above is encoded with the ISO/IEC 13818-2 system, the output variable length codes are as follows:

(0, 10) : 0000 0001 0011 0
(0, 1) : 10
(2, 22) : 0000 01 0000 10 0000 0001 0110
(0, 2) : 0100 0
(6, 1) : 0001 010
(3, −1) : 0011 11
(35, 1) : 0000 01 1000 11 0000 0000 0001
(10, −3) : 0000 01 0010 11 1111 1111 1101 10

As previously stated, the most commonly occurring run-length/level pairs are coded into short codes. Other rare run-length/level combinations are converted into longer 24 bit length codes. When the final run-length/level pair for a block is reached, a special end-of-block (EOB) code must be attached. In the previous example the EOB code '10' is concatenated onto the last run-length/level pair.

More detailed information about MPEG-2 encoding can be found in the following documents:

1) ISO/IEC-11171-1—PART 1: SYSTEMS, INFORMATION FOR DIGITAL STORAGE
2) ISO/IEC-11171-2—PART 2: VIDEO, INFORMATION TECHNOLOGY-CODING OF MOVING PICTURES & ASSOCIATED AUDIO FOR DIGITAL STORAGE
3) ISO/IEC-11171-1—PART 3: AUDIO, INFORMATION TECHNOLOGY-CODING OF MOVING PICTURES & ASSOCIATED AUDIO FOR DIGITAL STORAGE
4) ISO/IEC-CD-11171—INFORMATION TECHNOLOGY-CODING OF MOVING PICTURES & ASSOCIATED AUDIO FOR DIGITAL STORAGE
5) ISO/IEC 13818-1-ITU-T H.222: SYSTEMS
6) ISO/IEC 13818-2-ITU-T H.262: VIDEO
7) ISO/IEC 13818-3: AUDIO

Figure 3:
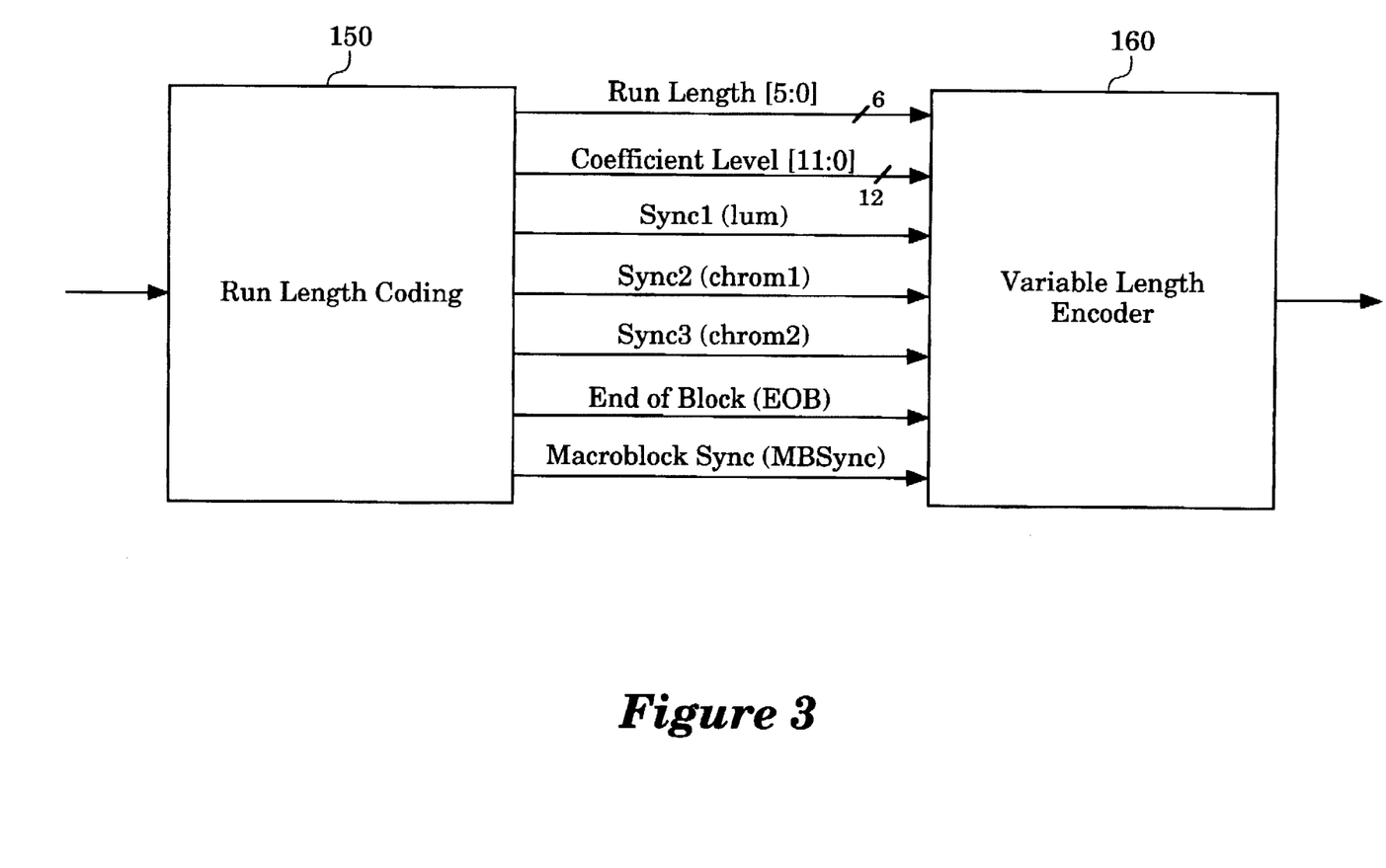
FIG. 3 is a block diagram illustrating the run length coded data inputs to the variable length coding process.

A more detailed view of the interaction between the Run Length Coding process, step 150, and the Variable Length Coding process, step 160, is shown in FIG. 3. FIG. 3 is a block diagram illustrating the run length coded data inputs to the Variable Length Coding process (step 160). In the embodiment illustrated, the run length coded data is comprised of a run length, a coefficient level, and synchronization data. The run length represents the number of zero coefficients between the previous non-zero coefficient and the current non-zero coefficient. Since the coefficients having an amplitude of zero have been accounted for in the run length, the coefficient level, at this stage, represents a non-zero signal amplitude. In this embodiment, the synchronization data is comprised of a Sync1 indicator, a Sync2 indicator, a Sync3 indicator, an end-of-block (EOB) indicator, and a Macroblock Sync indicator. The synchronization data informs the variable length coder of status having importance to the internal processing of the variable length encoder. The EOB indicator indicates the end of each 8×8 block. The Sync1 indicator indicates the beginning of the luminance blocks. The beginning of one of the two chrominance blocks within a given macroblock is signaled by the Sync2 indicator and the Sync3 indicator indicates the beginning of the other chrominance block. The Macroblock Sync indicator informs the variable length encoder that the beginning of a macroblock has been reached.

Figure 4:
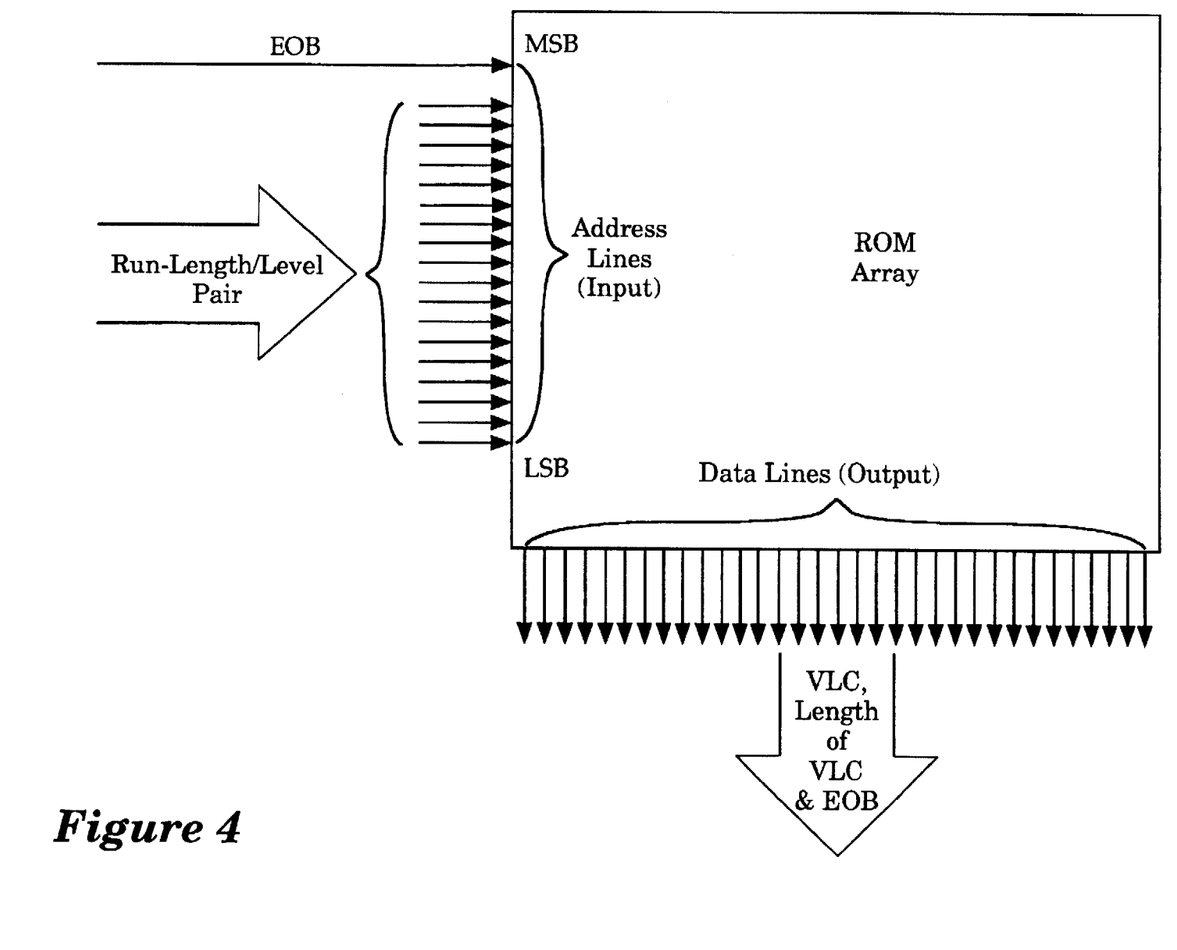
FIG. 4 is a block diagram of a ROM array being used to output variable length code data using zero run-length, coefficient level data, and an end-of-block indicator as inputs.

FIG. 4 is a block diagram of a ROM array being used to output variable length code data using zero run-length, coefficient level data, and an end-of-block indicator as inputs. To quickly perform the Variable Length Coding of step 160, most encoders use a specially programmed Read-Only-Memory (ROM) device. In one embodiment, a Read-Only-Memory (ROM) array is programmed to output the proper variable length code (VLC), VLC length, and EOB code when the run-length/level pair and EOB indicator are clocked in on the address lines of the ROM as illustrated by FIG. 4.

Again referring to FIG. 4, the Read-Only-Memory (ROM) array outputs VLC data which is comprised of a VLC, a VLC length, and an EOB code if the EOB indicator indicates the run-length/level pair represent the end of a block. To generate the VLC data defined in ISO/IEC 13818-2 as required for MPEG-2, the bit length required to represent VLC code length is 5 bits and required bit length to represent the largest VLC is 24 bits. Furthermore, if the VLC is the last VLC for an 8×8 block then the end-of-block (EOB) code must also be transmitted. Two different end-of-block (EOB) codes are used in the ISO/IEC 13818-2 standard. A first end-of-block (EOB) consists of a '10' code such that a total of 31 bits of bit width is required to represent the largest code (24 VLC bits, 5 VLC length bits, plus 2 bits of end-of-block (EOB) code). A second end-of-block (EOB) in the ISO/IEC 13818-2 standard consists of a '0110' code such that the total required bit width is lengthened to 33 bits.

Figure 5:
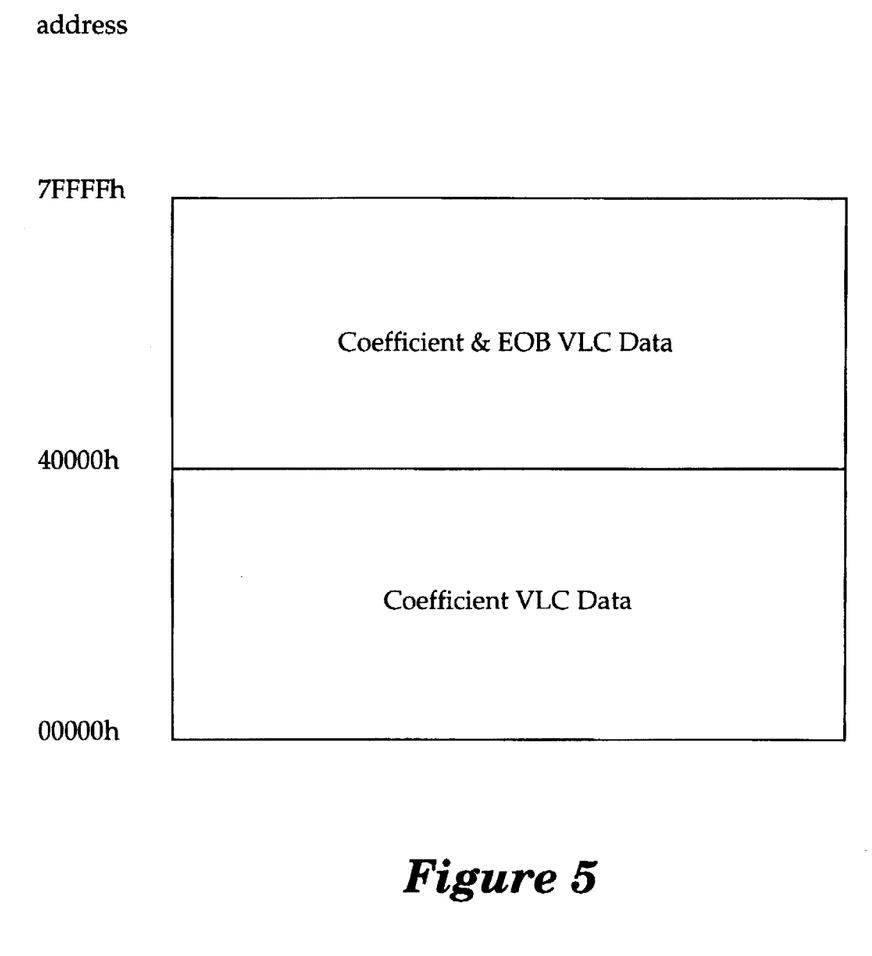
FIG. 5 is an illustration of one embodiment of a variable length code (VLC) table for simplifying encoder circuits.

FIG. 5 is an illustration of one embodiment of a variable length code (VLC) table for simplifying encoder circuits. The VLC table is stored in the ROM array of FIG. 4. In this embodiment, the VLC table is divided into an upper and a lower half. Both the upper half and the lower half of the VLC table contain a plurality of VLC data entries. Each of the VLC data entries in the lower half of the VLC table are comprised of VLC data including a VLC length and a VLC, while the VLC data entries in the upper half of the VLC table are comprised of VLC data including a VLC length, a VLC, and end-of-block (EOB) code. Thus, the lower table can be used for converting all run-length/level pairs not associated with the end of a block, and the upper table can be used to convert the run-length/level pairs associated with the end of a block.

Alternative storage devices exist for the ROM array used in this embodiment. In other embodiments, the storage device may include machine-readable mediums such as random access memory (RAM), magnetic disk storage mediums, optical storage mediums, flash memory devices, and/or other machine-readable mediums.

Each VLC data entry is associated with an address. As discussed with respect to FIG. 4, the address is comprised of the zero run-length, the coefficient level and the EOB indicator. In this embodiment, address bits 12 through 17 (address[17:12]) contain the zero run-length, address bits 0 through 11 (address[11:0]) contain the coefficient level. The most significant bit (MSB), address[18], contains the EOB indicator. In this embodiment, the EOB indicator has two states, an "end-of-block state" and a "not end-of-block state." When the input zero run-length and coefficient level represent the end of a block (e.g., the 64th coefficient or a multiple of 64), bit 18 of the address (address[18]) is set and the upper half of the VLC table is selected, otherwise the lower half of the VLC table is selected. Therefore, the EOB indicator effectively selects between the lower and upper half of the VLC table. The lower half of the VLC table is accessible via addresses 00000h through 3FFFFh inclusive—the upper half of the VLC table is accessible via addresses 40000h through 7FFFFh inclusive.

Of course, alternative embodiments can implement the VLC table with more or less address space, by ordering the address bits differently, or using other arrangements of the data within the ROM and still utilize the teachings of the invention. For example, if the VLC data entries of the upper and lower halves were swapped and the EOB indicator inverted the results would be unchanged. Also, instead of applying the EOB indicator at the highest level of translation (e.g., selecting a VLC table with the EOB indicator and then locating the appropriate VLC data entry with the remainder of the address), the EOB indicator could be applied at the lowest level of translation. For example, the two VLC data entries could be stored contiguously in the physical memory. Then the VLC table would be organized physically as one table, yet, remain logically accessed as two. The address bits without the EOB indicator could be used to narrow the choices of VLC data entries to two contiguous entries and the EOB indicator could then be used to select the appropriate VLC data entry. Further, the address ranges and the ordering of the fields that make up the address could be altered and still utilize the teachings of the invention.

Figure 6:
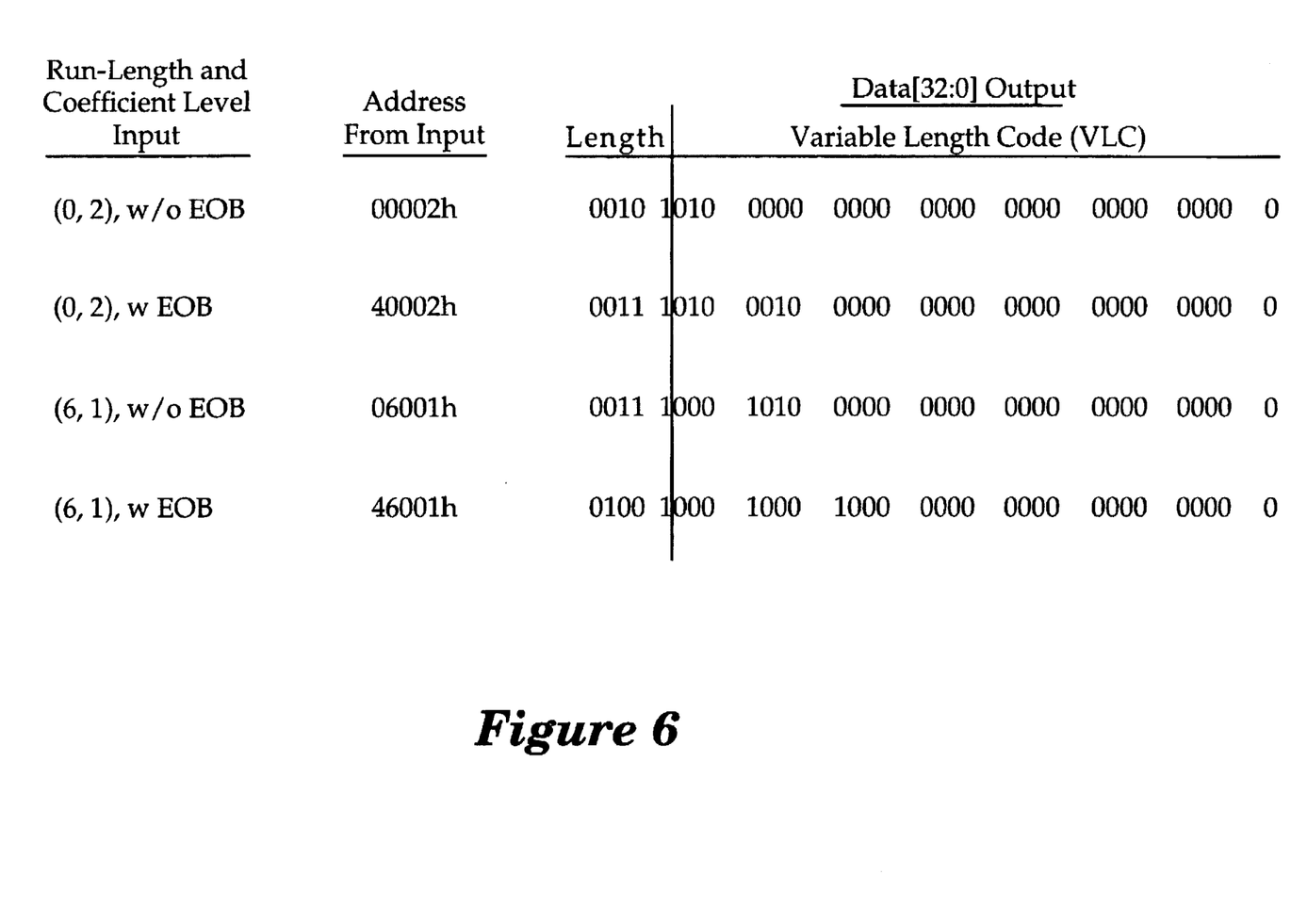
FIG. 6 is a table illustrating the relationship among zero run-length, coefficient level, physical address within the ROM array and the output variable length code data.

FIG. 6 is a table illustrating the relationship among zero run-length, coefficient level, physical address within the ROM array and the output variable length code data. In this embodiment, the first column shows the zero run-length and coefficient level and indicates whether or not the run-length/level pair requires an EOB code to be appended. The second column shows a physical address that results when the data from the first column are combined, as described earlier, to form the physical address. The third column illustrates the data that will be output (Data[32:0]) upon reading the corresponding physical address in the second column. The data in the third column shows the VLC data entry located at the physical address of the second column, corresponding to the run-length/level pair and EOB indicator of the first column. The VLC data entry contains a length field, a variable length code, and an EOB code if indicated by the first column. As described above, the VLC data entry is the data that will be output upon retrieval from the memory.

The table illustrates two example run-length/level pairs with and without EOB codes. The first two rows will now be described. In the first row, the zero run-length is 0 and the coefficient level is 2 and no EOB code is required. After concatenating the values in the manner described above, the corresponding physical address is 00002h. In this embodiment, this physical address corresponds to the lower half of the VLC table. At physical address 00002h, the VLC data entry corresponding to the run-length/level pair is shown in column 3. In the present example, the VLC data entry corresponding to the run-length/level pair (0,2) without an EOB code appended is 0010 1010 0000 0000 0000 0000 0000 0000 0. The VLC length is 5 (00101), the VLC is the next 5 bits (01000), and the rest of the VLC data entry is zero filled. In the second row, the zero run-length remains 0 and the coefficient level remains 2, but now an EOB code is required. Therefore, the address for the same run-length/level pair now becomes 40002h because address[18] is set. This physical address corresponds to the upper half of the VLC table. At physical address 40002h, the VLC data entry corresponding to the run-length/level pair is shown in column 3. The VLC data entry corresponding to the run-length/ level pair (0,2) with an EOB code appended is 0011 1010 0010 0000 0000 0000 0000 0000 0. The VLC length is 7 (00111), the VLC is the next 7 bits (0100010), and the remainder of the VLC data entry is zeros.

The present invention optimizes the encoding time of a digital video encoder system by processing the 8×8 blocks consecutively. Furthermore, the present invention provides for the conversion of the run-length/level pairs at the end of a block without special circuitry for adding EOB codes and without buffer memories for temporarily storing coefficient data.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A method of performing variable length coding, the method comprising the steps of:

receiving an input code, the input code including an end-of-block (EOB) indicator, a zero run-length, and a coefficient level;

converting the input code into a corresponding variable length code (VLC) by forming an address based upon the EOB indicator, the zero run-length, and the coefficient level, applying the address to one or more storage devices, the one or more storage devices having stored therein a first plurality of VLC data entries and a second plurality of VLC data entries, retrieving the corresponding VLC from a first VLC data entry in the first plurality of VLC data entries if the EOB indicator indicates that the input code is associated with the end of a block, and retrieving the corresponding VLC from a second VLC data entry in the second plurality of VLC data entries if the EOB indicator indicates that the input code is not associated with the end of a block; and outputting the corresponding VLC.

2. The method of claim 1, where each of the first plurality of VLC data entries contain a length, a VLC, and an EOB code, and wherein each of the second plurality of VLC data entries contain a length and a VLC, but no EOB code.

3. The method of claim 1, wherein the address has a most significant bit (MSB), the step of forming an address based upon the EOB indicator, the zero run-length, and the coefficient level further includes the step of setting the MSB of the address to the EOB indicator.

4. The method of claim 3, wherein the address has a middle portion and a least significant portion, the method further including the steps of: setting the middle portion of the address to the zero run-length; and setting the least significant portion of the address to the coefficient level.

5. The method of claim 4, wherein the address comprises 19 bits, the middle portion comprises 6 bits, and the least significant portion comprises 12 bits.

6. A method of generating variable length code (VLC) data to be included in a compressed video data stream, the compressed video data stream divided into a plurality of blocks, the method comprising the steps of:

receiving an input code;

applying a portion of the input code to a storage device, the storage device having stored therein a first plurality of VLC data entries and a second plurality of VLC data entries, each of the first plurality of VLC data entries corresponding to input codes that are associated with the end of a block, each of the second plurality of VLC data entries corresponding to input codes that are not associated with the end of a block;

retrieving a VLC data entry corresponding to the input code from the first plurality of VLC data entries if the input code contains an indication that the input code is associated with the end of a block;

retrieving a VLC data entry corresponding to the input code from the second plurality of VLC data entries if the input code contains an indication that the input code is not associated with the end of a block; and outputting VLC data from the retrieved VLC data entry.

7. The method of claim 6, where each of the first plurality of VLC data entries contain a length, a VLC, and an EOB code, and wherein each of the second plurality of VLC data entries contain only a length and a VLC.

8. A method of performing variable length coding, the method comprising the steps of:

providing a first variable length code (VLC) table in a storage device, the first VLC table containing only VLC data entries that are not associated with the end of a block, the VLC data entries of the first VLC table each including a length and a VLC, but no end-of-block (EOB) code;

providing a second VLC table in the storage device, the second VLC table containing only VLC data entries that are associated with the end of a block, the VLC data entries of the second VLC table each including a length, a VLC, and an EOB code;

receiving an input code, the input code including an EOB indicator, a zero run-length, and a coefficient level; and retrieving the VLC data entry corresponding to the input code from the first VLC table or the second VLC table based upon the EOB indicator.

9. The method of claim 8, the method further including the steps of:

forming an address based upon the EOB indicator, the zero run-length, and the coefficient level; and applying the address to the storage device.

10. The method of claim 9, wherein the address has a most significant bit (MSB), the step of forming an address based upon the EOB indicator, the zero run-length, and the coefficient level further includes the step of setting the MSB of the address to the EOB indicator.

11. An apparatus for generating variable length code (VLC) data, the apparatus comprising:

a first coding device configured to receive zig-zag scanned data and to produce run length coded data, the run length coded data comprising input codes, each input code including a zero run-length, a coefficient level, and an end-of-block (EOB) indicator; and a second coding device coupled to the run length coder to receive a current input code, the second coding device including a storage device having stored therein a first VLC table and a second VLC table, the first VLC table containing only VLC data entries that are associated with the end of a block, the second VLC table containing only VLC data entries that are not associated with the end of a block, the second coding device configured to retrieve a VLC data entry corresponding to the current input code from one of the first and second VLC tables and to output VLC data from the VLC data entry.

12. The apparatus of claim 11, wherein the second coding device is configured to retrieve a VLC data entry corresponding to the current input code by:

choosing one of the first and second VLC tables as a selected VLC table based upon the EOB indicator of the current input code; and retrieving the VLC data entry from the selected VLC table based upon the zero run-length and the coefficient level of the current input code.

13. The apparatus of claim 11, wherein the second coding device is configured to retrieve a VLC data entry corresponding to the current input code by:

forming an address based upon the EOB indicator, the zero run-length, and the coefficient level of the current input code;

applying the address to the storage device;

retrieving the VLC data entry from the first VLC table if the EOB indicator indicates that the current input code is associated with the end of a block; and retrieving the VLC data entry from the second VLC table if the EOB indicator indicates that the current input code is not associated with the end of a block.

* * * * *